United States Patent [19]

Choi

[11] Patent Number: 5,670,420

[45] Date of Patent: Sep. 23, 1997

[54] METHOD OF FORMING METAL INTERCONNECTION LAYER OF SEMICONDUCTOR DEVICE

[75] Inventor: Kyeong Keun Choi, Ichonkun, Rep. of Korea

[73] Assignee: Hyundai Electronics Industries Co., Ltd., Rep. of Korea

[21] Appl. No.: 555,112

[22] Filed: Nov. 8, 1995

[30] Foreign Application Priority Data

Dec. 5, 1994 [KR] Rep. of Korea ............... 1994-32859

[51] Int. Cl.⁶ ..................... H01L 21/44; H01L 21/48
[52] U.S. Cl. .................. 437/189; 437/190; 437/192; 437/195
[58] Field of Search ..................... 437/189, 195, 437/190, 192

[56] References Cited

U.S. PATENT DOCUMENTS

| | | |
|---|---|---|
| 4,742,014 | 5/1988 | Hooper et al. ............ 437/192 |
| 5,071,518 | 12/1991 | Pan ........................ 437/195 |
| 5,130,274 | 7/1992 | Harper et al. ............ 437/195 |
| 5,312,774 | 5/1994 | Nakamura et al. ....... 437/192 |
| 5,391,517 | 2/1995 | Gelatos et al. ........... 437/190 |

FOREIGN PATENT DOCUMENTS

| | | |
|---|---|---|
| 5101734 | 4/1993 | Japan . |
| 7078869 | 3/1995 | Japan . |
| 7078815 | 3/1995 | Japan . |

*Primary Examiner*—Chandra Chaudhari
*Assistant Examiner*—Lynne A. Gurley
*Attorney, Agent, or Firm*—Blakely Sokoloff Taylor & Zafman

[57] ABSTRACT

A method of forming a metal interconnection layer of a semiconductor device is disclosed as forming a barrier metal for preventing an atomic migration between a metal film for an interconnection and a lower conduction layer being contacted with the metal film by an ion implantation, so that it prevents metal atoms diffusing into a Si substrate in a deep and narrow contact hole and it makes a copper film to be deposited on an oxide with ease, thereby carrying out an excellent metallization process.

8 Claims, 3 Drawing Sheets

METHOD OF FORMING METAL INTERCONNECTION LAYER OF SEMICONDUCTOR DEVICE

BACKGROUND OF THE INVENTION

The present invention relates to a method of forming a metal interconnection layer in a semiconductor device fabrication process, and more particularly, to a method of forming a barrier metal by an ion implantation.

In forming a metal interconnection layer of a semiconductor device, a barrier metal has been used to prevent an atomic migration between a metal film and a lower conduction layer which is contacted with the metal film through a via hole or a contact hole, in general. Metals such as titanium nitride(TiN), tantalum(Ta), chrome(Cr) and tungsten(W), etc., are mainly used as a barrier metal of copper(Cu) which is used for a contact plug or a metal line.

A sputtering method or a chemical vapor deposition method has been used to form a barrier metal on a wafer in a prior art. However, the barrier metal has a poor step coverage in a deep and narrow via hole or contact hole, so that it can not sufficiently serve as a barrier.

And, when a copper interconnection layer is exposed in an air, it changes the property of matter such as an oxidation in the surface thereof so that the copper film is corroded.

SUMMARY OF THE INVENTION

It is an object of the present invention to provide a method of forming a metal interconnection layer which can improve step coverage of a barrier metal and prevent corrosion of a copper film by forming a surface protection film for the barrier metal and the copper film through an ion implantation.

To accomplish the object of the present invention, there is provided a method for forming a metal interconnection layer of a semiconductor device, the method comprising:

forming a barrier metal for preventing an atomic migration between a metal film and a lower conduction layer which is contacted with the metal film, by an ion implantation.

BRIEF DESCRIPTION OF THE ATTACHED DRAWINGS

FIGS. 1A to 1D are cross-sectional views for illustrating a method of forming a metal interconnection layer in accordance with an embodiment of the present invention; and FIG. 2 is a cross-sectional view showing the structure where a metal interconnection layer is formed in a contact hole in accordance with an embodiment of the present invention.

DETAILED DESCRIPTION OF THE INVENTION

Hereinafter, the preferred embodiment of a method of forming a metal interconnection layer of a semiconductor device in accordance with the present invention will be described with reference to the attached FIGS. 1A through 1D and 2.

Figure 1A:
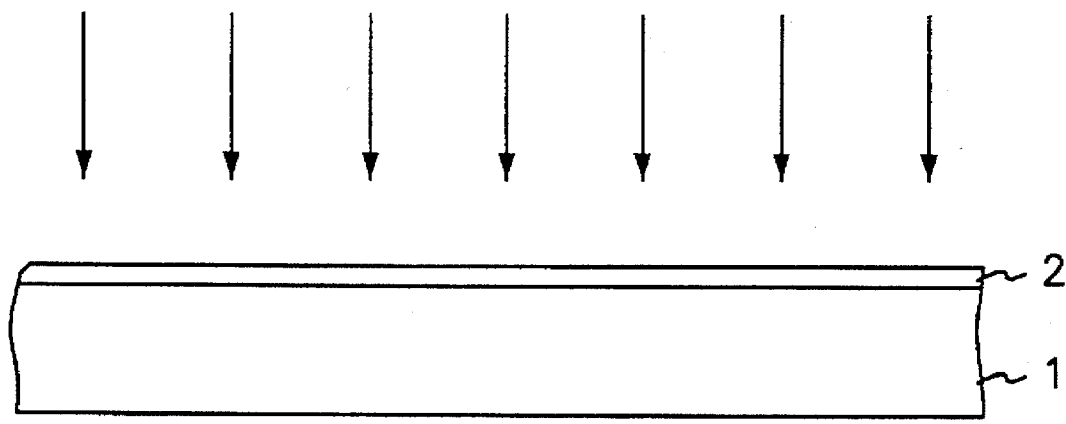

FIGS. 1A to 1D are cross-sectional views illustrating a method of forming a metal interconnection layer of a semiconductor device in case a tungsten film is used for a barrier metal. First, as shown in FIG. 1A, a first tungsten film 2 is formed at a thickness of 100 to 500 Å by ion-implanting tungsten in the surface of an oxide film 1. At this constant, the ion-implantation should be carried out with low energy and high dose so as to form the tungsten film. Conventionally, tungstens are ion-implanted using $WF_6$ as a gas source during a constant time at dose of $10^{20}$ to $10^{22}$ ions/cm$^2$ with 50 to 150 keV within an implanter, thereby forming the first tungsten film 2 having a thickness of 100 to 500 Å in the surface of the lower oxide film 1.

Subsequently, an annealing is carried out during 30 to 90 minutes at temperature of 600 deg. C in a process tube of $N_2$ or $H_2$ ambient so as to detach and activate residue of tungsten (WFx, x=1 to 6) at the ion implantation.

Figure 1B:
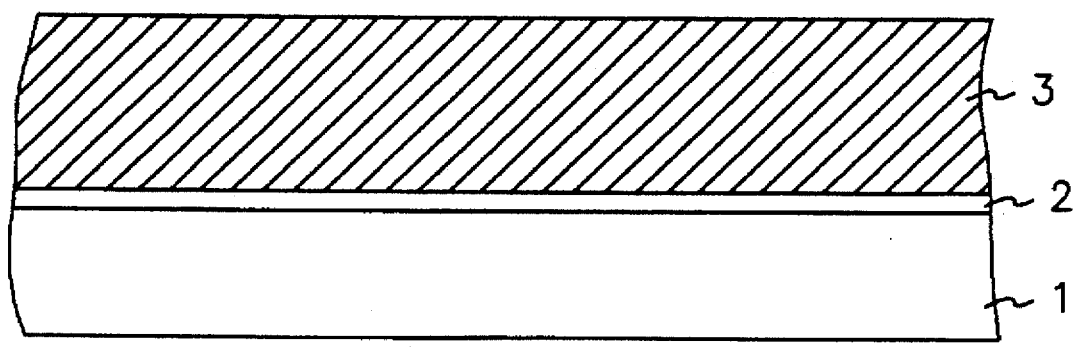

As shown in FIG. 1B, over the ion implanted tungsten film 2, a copper film 3 is formed at a thickness of 300 Å by a metal organic chemical vapor deposition.

Figure 1C:
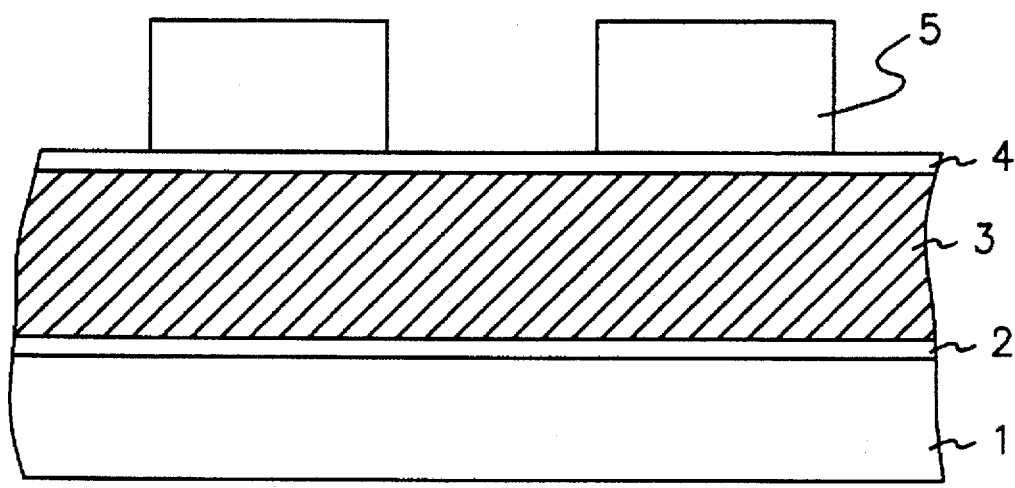

Next, as shown in FIG. 1C, a second tungsten film 4 is formed by ion-implanting tungsten into the copper film 3 so as to restrain change of a material property of the copper film 3 and then a photosensitive film pattern 5 which is a mask for a metal interconnection is formed.

Figure 1D:
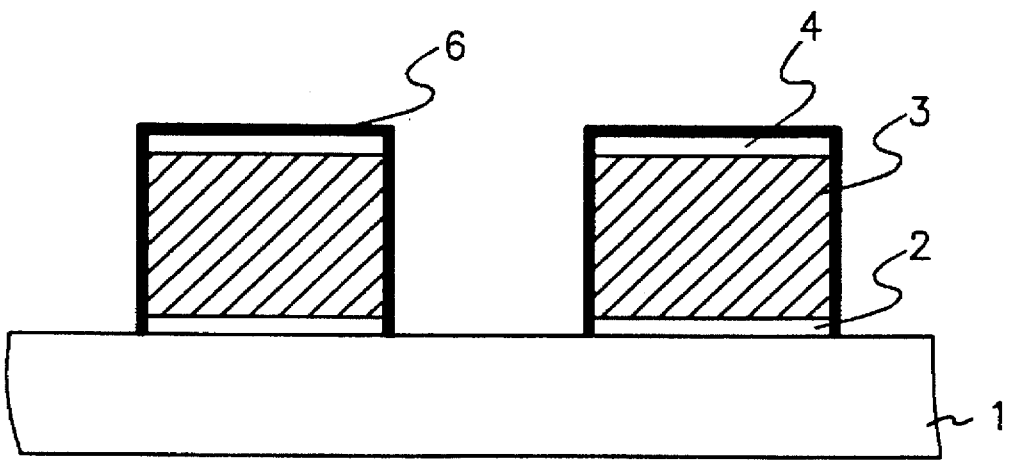

Finally, as shown in FIG. 1D, the second tungsten film 4, the copper film 3 and the first tungsten film 2 are successively dry etched by using the photosensitive film pattern 5 as an etch mask to form a metal interconnection. The photosensitive film pattern 5 is removed and then a third tungsten film 6 is formed at a thickness of 300 to 5000 Å by a selective deposition method so as to prevent the metal interconnection oxidizing due to an exposure in an atmosphere in which the cooper film can be oxidized.

Figure 2:
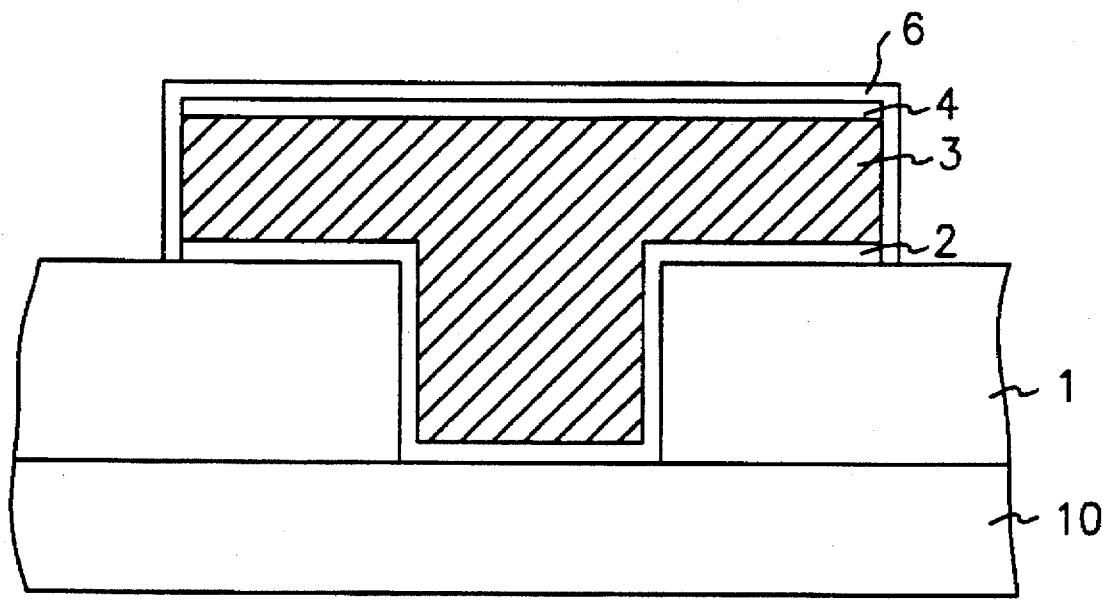

FIG. 2 illustrates the structure where a metal interconnection layer consisting of the first to third tungsten films 2, 4 and 6 and the copper film 3 is formed in a contact hole, by carrying out the processes of FIGS. 1A to 1D. The reference number 1 designates an oxide film.

According to the present invention, the step coverage in a deep and narrow contact hole is improved, an adhesion between an oxide film and a copper film can be increased and a corrosion due to an oxidation of the copper film can be prevented by using a tungsten film which is formed not by a CVD or PECVD deposition but by an ion implantation as a barrier metal and junction layer of a CVD copper film, so that a metal interconnection of an excellent characteristic can be formed.

While the present invention has been particularly shown and described with reference to particular embodiments thereof, it will be understood by those skilled in the art that various changes in form and details may be effected therein without departing from the spirit and scope of the invention as defined by the appended claims.

What is claimed is:

1. A method for forming a metal interconnection of a semiconductor device, comprising the steps of:

providing an insulating film having an opening exposing a conducting film;

implanting refractory metal ions into the insulating film and the conducting film, wherein the refractory metal ions form a first refractory metal film on the insulating film and the conducting film;

forming a metal wiring layer by a chemical vapor deposition method on the resulting structure for a metal interconnection;

implanting refractory metal ions into the metal wiring layer so that a second refractory metal film is formed on the resulting structure for preventing changes in physical properties of the metal wiring layer;

patterning the first refractory metal film, the metal wiring layer and the second refractory metal film, using a metal interconnection mask; and forming a third refractory metal film on the sidewall of the patterned metal wiring by a selective deposition method.

2. The method of claim 1, further comprising the step of annealing the first refractory metal film after the formation of the first refractory metal film.

3. The method of claim 2, wherein the annealing step is carried out in a process tube of $H_2$ or $N_2$ ambient during 30 to 90 minutes at a temperature of approximately 600° C.

4. The method of claim 1, wherein the metal wiring layer is a copper film.

5. The method of claim 4, wherein the metal wiring layer is deposited by a metal organic chemical vapor deposition.

6. The method of claim 1, wherein the first refractory metal film is a tungsten film having a thickness of 100 to 500 Å.

7. The method of claim 6, wherein the first refractory metal film is formed by implanting tungsten using $WF_6$ as a gas source at dose of $10^{20}$ to $10^{22}$ ions/cm$^2$ with an energy of 50 to 150 keV.

8. The method of claim 1, wherein the second and third refractory metal films are a tungsten film.

* * * * *